(12) United States Patent
Shimizu et al.

(10) Patent No.: US 7,332,749 B2
(45) Date of Patent: Feb. 19, 2008

(54) JUNCTION-GATE TYPE STATIC INDUCTION THYRISTOR AND HIGH-VOLTAGE PULSE GENERATOR USING SUCH JUNCTION-GATE TYPE STATIC INDUCTION THYRISTOR

(75) Inventors: Naohiro Shimizu, Miura (JP); Takayuki Sekiya, Nissin (JP)

(73) Assignee: NGK Insulators, Ltd., Nagoya (JP)

( * ) Notice: Subject to any disclaimer, the term of this patent is extended or adjusted under 35 U.S.C. 154(b) by 402 days.

(21) Appl. No.: 11/073,967

(22) Filed: Mar. 7, 2005

(65) Prior Publication Data
US 2005/0218423 A1    Oct. 6, 2005

(30) Foreign Application Priority Data
Mar. 18, 2004    (JP) ............................. 2004-077575

(51) Int. Cl.
*H01L 29/32* (2006.01)
*H01L 29/74* (2006.01)
*H01L 31/111* (2006.01)

(52) U.S. Cl. .................. 257/107; 257/110; 257/120; 257/144; 257/152; 257/164; 438/133; 438/136

(58) Field of Classification Search .............. 257/107, 257/110–111, 120, 126, 129, 144, 152, 168, 257/164–165, E29.115, E29.125, E29.196, 257/E29.036; 438/133, 136–140
See application file for complete search history.

(56) References Cited

U.S. PATENT DOCUMENTS 5,319,222 A * 6/1994 Shekar et al. ............... 257/138
5,828,101 A * 10/1998 Endo ........................... 257/330
6,111,290 A * 8/2000 Uenishi et al. .............. 257/331
6,218,217 B1 * 4/2001 Uenishi et al. .............. 438/138

OTHER PUBLICATIONS

Naohiro Shimizu et al., "Analysis of actions of Static Induction Thyristor on Inductive Energy Storage type power supply", 16th Symposium of Static Induction Devices, ISSN 1340-5853, SSID-03-8, pp. 49-53, Jun. 13, 2003.
Naohiro Shimizu et al., "Pulse Switching Characteristics of SI-Thyristor relating to the Applied Voltage", Symposium of Institute of Electrical Engineers of Japan, pp. 235-236, Mar. 27, 2002.
N. Shimizu et al., "Present Status of Static Induction Thyristors", Proc. Of RPIA 2002, The International Progress in Induction Accelerators, Tsukuba, pp. 78-81, 2002.

* cited by examiner

*Primary Examiner*—Zandra V. Smith
*Assistant Examiner*—Thanh Y. Tran
(74) *Attorney, Agent, or Firm*—Burr & Brown

(57) ABSTRACT

A compact, inexpensive static induction thyristor (SIThy) which is less likely to be broken down at a high voltage rise-up rate during operation and which is used in a high-voltage pulse generator capable of generating a high-voltage short pulse is provided. Thicknesses and impurity concentrations of a base region and a buffer region are determined such that a peak voltage obtained by a peak current at which a punch-through state is brought about does not exceed a breakdown voltage of the SIThy. Such design can achieve an SIThy having a self protecting function of autonomously preventing its breakdown without compromising a turn-on performance in which the peak voltage does not drastically exceed the breakdown voltage of the SIThy even when the peak current increases. Further, a compact SIThy capable of generating a short pulse can be achieved by reducing a gate-channel current-carrying area to a minimum.

4 Claims, 10 Drawing Sheets

FIG. 6

| PEAK CURRENT Ip | TARGET PEAK VOLTAGE | STATE OF DEPLETION LAYER IN N-BASE REGION | ON-STATE VOLTAGE Von | PEAK VOLTAGE Vd | PULSE WIDTH tw |
|---|---|---|---|---|---|
| 50A | 1000V | | 4V | 1000V | 100 |
| 110A | 2000V | | 7V | 2000V | 120 |
| 170A | 3000V | | 12V | 3000V | 130 |
| 250A | 4000V | PUNCH-THROUGH STATE | 19V | 4000V | 150 |
| 350A | 5000V | | 28V | 4200V | 300 |

JUNCTION-GATE TYPE STATIC INDUCTION THYRISTOR AND HIGH-VOLTAGE PULSE GENERATOR USING SUCH JUNCTION-GATE TYPE STATIC INDUCTION THYRISTOR

BACKGROUND OF THE INVENTION

1. Field of the Invention

The present invention relates to a junction-gate type static induction thyristor for use in a high-voltage pulse generator.

2. Description of the Background Art

A technique for performing laser oscillation and gas decomposition using plasma generated by discharging a high-voltage pulse has conventionally been studied. In this technique, it is desired to use a high-voltage short pulse, however, to generate such a high-voltage short pulse, a large-scale high-voltage pulse generator has been required since a high-voltage power supply, for example, needs to be provided therein.

On the other hand, a small, inexpensive high-voltage pulse generator for generating a high-voltage short pulse is disclosed in "Analysis of actions of Static Induction Thyristor on Inductive Energy Storage type power supply" Naohiro Shimizu et al., 16th Symposium of Static Induction Devices, ISSN 1340-5853, SSID-03-8, pp. 49-53 (Jun. 13, 2003). A circuit employed as the high-voltage pulse generator disclosed in this document mainly makes use of a turn-off action of a static induction thyristor, which is called an IES (Inductive Energy Storage) circuit.

This IES circuit has an outstanding advantage in that it can be constructed compactly at low costs, however, a specific configuration of a static induction thyristor (hereinafter also referred to as "SIThy") used therein has not fully been studied. Therefore, depending on operating conditions of the high-voltage pulse generator, there are some cases in which an SIThy is broken down and in which a high-voltage short pulse cannot be generated. In some other cases, an SIThy for use in the IES circuit is designed redundantly more than necessary, resulting in size increase, thus increasing manufacturing costs, or frequencies generated cannot be increased due to great loss in the SIThy.

SUMMARY OF THE INVENTION

It is an object of the present invention to provide a small, inexpensive SIThy which is less likely to be broken down during operation at a high voltage rise-up rate and which is used in a high-voltage pulse generator capable of generating a high-voltage short pulse.

The present invention is directed to a junction-gate type static induction thyristor.

A first aspect of the invention is directed to the junction-gate type static induction thyristor for use in the high-voltage pulse generator which uses an inductive element, a path from an anode to a cathode of the junction-gate type static induction thyristor being connected to the inductive element in series. The junction-gate type static induction thyristor comprises: a p-emitter region connected to the anode; an n-buffer region provided on the p-emitter region; an n-base region provided on the n-buffer region; a p-base region buried in the n-base region and connected to a gate of the junction-gate type static induction thyristor; and an n-emitter region provided on the n-base region and connected to the cathode. A voltage of a high-voltage pulse generated by the high-voltage pulse generator saturates at no more than a saturation voltage when electric energy supplied from a power supply is increased with an increase in energy of the high-voltage pulse, the saturation voltage being not more than an anode-cathode forward breakdown voltage obtained when a gate-cathode circuit of the junction-gate type static induction thyristor is shorted.

The voltage of the high-voltage pulse does not drastically exceed the breakdown voltage of the junction-gate type static induction thyristor, and besides, a voltage rise-up rate of a forward high-voltage pulse to be generated is controlled. Therefore, breakdown of the junction-gate type static induction thyristor is avoided.

Preferably, in the junction-gate type static induction thyristor, a gate electrode and the p-base region are in ohmic contact. The gate electrode is capable of flowing current therethrough.

Carriers are pulled out from the p-base region at high speeds, which allows a turn-off action of the junction-gate type static induction thyristor to be performed at high speeds. Therefore, it is possible to generate a high-voltage pulse which rises up at high speeds.

A second aspect of the invention is directed to the junction-gate type static induction thyristor for use in a high-voltage pulse generator which uses an inductive element, a path from an anode to a cathode of the junction-gate type static induction thyristor being connected to the inductive element in series. The junction-gate type static induction thyristor comprises: a p-emitter region connected to the anode; an n-buffer region provided on the p-emitter region; an n-base region provided on the n-buffer region; a p-base region buried in the n-base region and connected to a gate of the junction-gate type static induction thyristor; and an n-emitter region provided on the n-base region and connected to the cathode. An effective channel area is not larger than a maximum channel area, the effective channel area defining a current capacity of the junction-gate type static induction thyristor, the maximum channel area being determined on the basis of electric energy supplied from the power supply in order to generate the high-voltage pulse and a rate of change of voltage of the high-voltage pulse with time at a rising edge of the high-voltage pulse.

Since the effective channel area is minimized, a physical size or current-carrying capacity of the junction-gate type static induction thyristor is reduced to a minimum.

A third aspect of the invention is directed to the junction-gate type static induction thyristor for use in a high-voltage pulse generator which uses an inductive element, a path from an anode to a cathode of the junction-gate type static induction thyristor being connected to the inductive element in series. The junction-gate type static induction thyristor comprises: a p-emitter region connected to the anode; an n-buffer region provided on the p-emitter region; an n-base region provided on the n-buffer region; a p-base region buried in the n-base region and connected to a gate of the junction-gate type static induction thyristor; and an n-emitter region provided on the n-base region and connected to the cathode. The width and impurity concentration of a channel formed by the n-base region in a channel structure formed by the n-base region and the p-base region are determined such that: an anode-gate breakdown voltage of the junction-gate type static induction thyristor maintains a value obtained in the case where the channel structure is formed only by the p-base region; and an anode-cathode forward breakdown voltage obtained when a gate-cathode circuit is shorted is equal to the anode-gate breakdown voltage.

It is possible to generate a high-voltage pulse having a voltage substantially at the same level as a breakdown voltage obtained when applying a negative bias to the gate in the operation of the high-voltage pulse generator.

A fourth aspect of the invention is directed to the junction-gate type static induction thyristor for use in a high-voltage pulse generator which uses an inductive element, a path from an anode to a cathode of the junction-gate type static induction thyristor being connected to the inductive element in series. The junction-gate type static induction thyristor comprises: a p-emitter region connected to the anode; an n-buffer region provided on the p-emitter region; an n-base region provided on the n-buffer region; a p-base region buried in the n-base region and connected to a gate of the junction-gate type static induction thyristor; and an n-emitter region provided on the n-base region and connected to the cathode. The width and impurity concentration of a channel formed by the n-base region in a channel structure formed by the n-base region and the p-base region are determined such that the channel in the channel structure is brought into a non-conducting state by a rise in gate potential of the junction-gate type static induction thyristor when current supply to the anode-cathode path is stopped during generation of the high-voltage pulse by the high-voltage pulse generator.

It is possible to generate a high-voltage pulse having a voltage substantially at the same level as a breakdown voltage obtained when applying a negative bias to the gate in the operation of the high-voltage pulse generator.

The invention is also directed to a high-voltage pulse generator using a junction-gate type static induction thyristor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows relationships among the state of depletion layer, on-state voltage, peak voltage and pulse width in the n-base region shown in FIG. 3 when peak current is varied in five ways from 50 to 350 A in order to obtain a target peak voltage from 1000 to 5000 V;

DESCRIPTION OF THE PREFERRED EMBODIMENTS

In a pulse generator having an SIThy as an opening switch making use of the turn-off function of the SIThy, the SIThy may permanently be broken down when applying an excessive voltage rise-up rate, dV/dt, e.g., 2 kV/µs or more to the SIThy. A new high-voltage pulse generator which overcomes this disadvantage of the SIThy is an IES circuit capable of increasing a breakdown-voltage rise-up rate of the SIThy to reach a threshold value of breaking a semiconductor substrate (100 kV/µs or more). Hereinbelow, a high-voltage pulse generator using such an IES circuit will be described.

The high-voltage pulse generator according to the preferred embodiment of the present invention generates a high-voltage short pulse using electric energy supplied from a dc power supply. The high-voltage pulse generator is used, for example, to generate a discharge plasma for gas decomposition, and more particularly used as, for example, a high-voltage pulse generator constituting small exhaust gas abatement equipment to be installed in an automobile severely restricted in a power supply to be used and installation space for decomposing atmospheric pollutants such as nitrogen oxide.

The high-voltage pulse generator is provided in a state housed in a small enclosure having a volume of not more than 10 cm$^3$. The high-voltage pulse generator generates a high-voltage short pulse making use of good turn-off characteristics of the SIThy. That is, the high-voltage pulse generator generates a high-voltage short pulse using the SIThy as a closing switch and an opening switch.

IES Circuit as Pulsed Power Supply

Figure 1:
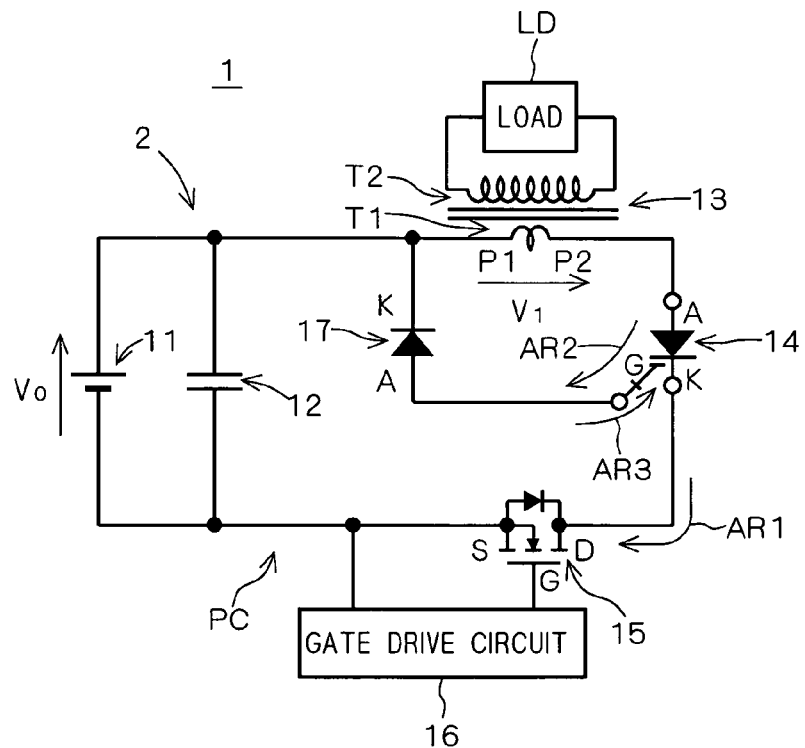
FIG. 1 is a circuit diagram of one example of an IES circuit.

A high-voltage pulse generator 1 according to the preferred embodiment is an IES (Inductive Energy Storage) circuit for performing turn-off actions using an opening switch function of the SIThy as well as its closing switch function to generate a high voltage between the gate and anode of the SIThy. FIG. 1 is a circuit diagram illustrating an IES circuit 2 used as the high-voltage pulse generator 1.

The IES circuit 2 includes a low-voltage dc power supply 11 serving as a current supply. The low-voltage dc power supply 11 is not limited to a specific embodiment, but, for example, an automotive low-voltage lead battery may be used as the low-voltage dc power supply 11. Voltage $V_0$ in the low-voltage dc power supply 11 is allowed to be extremely lower than peak voltage $P_D$ of a high-voltage pulse generated by the IES circuit 2. For instance, the voltage $V_0$ is allowed to fall within the range of several tens to several hundreds of volts, typically from 40 to 150 V, even when the peak voltage $P_D$ of a primary voltage $V_1$ generated on a primary winding T1 of a step-up transformer 13 which will be described later reaches 4 kV. The lower limit of this voltage $V_0$ is determined to be not lower than a latching voltage in an SIThy 14 which will be described later. The IES circuit 2 is capable of using such a low-voltage dc power supply as an electric energy source, and therefore, can be constructed compactly at low costs.

A step-up pulse generating section PC and a charging capacitor 12 are connected in parallel to the low-voltage dc power supply 11. The charging capacitor 12 apparently lowers the impedance of the dc power supply 11 to reinforce the current supply capability of the dc power supply 11. The voltage $V_0$ in the dc power supply 11 is stepped up in the step-up pulse generating section PC. This step-up pulse generating section PC includes the step-up transformer 13, the SIThy 14, an MOSFET (Metal Oxide Semiconductor Field Effect Transistor; hereinafter briefly referred to as "FET" as well) 15, a gate drive circuit 16 and a diode 17.

In the IES circuit 2, the primary winding T1 of the step-up transformer 13, the anode-cathode (A-K) path of the SIThy 14 and the drain-source (D-S) path of the FET 15 are connected in series. More specifically, one end P1 of the primary winding T1 of the step-up transformer 13 is connected to the positive electrode of the low-voltage dc power supply 11, the other end P2 of the primary winding T1 to the anode A of the SIThy 14, the cathode K of the SIThy 14 to the drain D of the FET 15, and the source S of the FET 15 to the negative electrode of the dc power supply 11. Accordingly, the dc power supply 11 is capable of supplying current to these circuit components. Further, in the IES circuit 2, the anode-gate (A-G) path of the SIThy 14 is connected to the primary winding T1 of the step-up transformer 13 through the diode 17. More specifically, the gate G of the SIThy 14 is connected to the anode A of the diode 17, and the cathode K of the diode 17 to the one end P1 (i.e., the positive electrode of the dc power supply 11). The gate drive circuit 16 is connected between the gate G and source S of the FET 15.

The step-up transformer 13 is additionally provided in the case of further stepping up a high-voltage pulse given on the primary winding T1 and outputting it to the secondary winding T2. A load LD is connected to the secondary winding T2 of the step-up transformer 13. The primary winding T1 of the step-up transformer 13 serves as an inductive element having a self-inductance L.

The SIThy 14 can be turned on/off in response to a signal given to the gate G thereof, and has a practical breakdown voltage (anode-cathode (A-K) forward breakdown voltage; this also applies to the description hereinbelow) not lower than the peak voltage $P_D$ obtained when a high-voltage pulse of a desired voltage value is generated on the primary winding T1 of the step-up transformer 13. Here, this "practical breakdown voltage" is a voltage lower than a threshold breakdown voltage (anode-cathode (A-K) forward breakdown voltage; this also applies to the description hereinbelow) $V_{AKS}$ which gives the SIThy 14 an irreversible change, and typically about 80% of the threshold breakdown voltage $V_{AKS}$. The threshold breakdown voltage $V_{AKS}$ corresponds to the anode-cathode (A-K) forward breakdown voltage when the gate-cathode (G-K) circuit of the SIThy 14 is shorted (this state will hereinafter be referred to as a "G-K shorted state" as well).

The FET 15 is a switching device in which the conducting state of the drain-source (D-S) circuit changes in response to a signal transmitted from the gate drive circuit 16. It is preferable that an on-state voltage or on-state resistance of the FET 15 should be low. Further, a breakdown voltage in the FET 15 needs to be higher than the voltage $V_0$.

The diode 17 is provided to cut off current which flows when applying a positive bias to the gate G of the SIThy 14, that is, to prevent the SIThy 14 from being driven by current when applying a positive bias to the gate G of the SIThy 14.

General Configuration of SIThy

The SIThy 14 can be turned on by applying a positive gate voltage to the gate G, and turned off by flowing a negative gate current to the gate G. A general configuration of such SIThy 14 will be described now.

The SIThy 14 is obtained by forming a plurality of semiconductor regions in an n-type semiconductor substrate by conducting impurity diffusion or epitaxial growth. The n-type semiconductor substrate is made of at least one selected from the group consisting of Si, SiC and GaN, for example.

Figure 2:
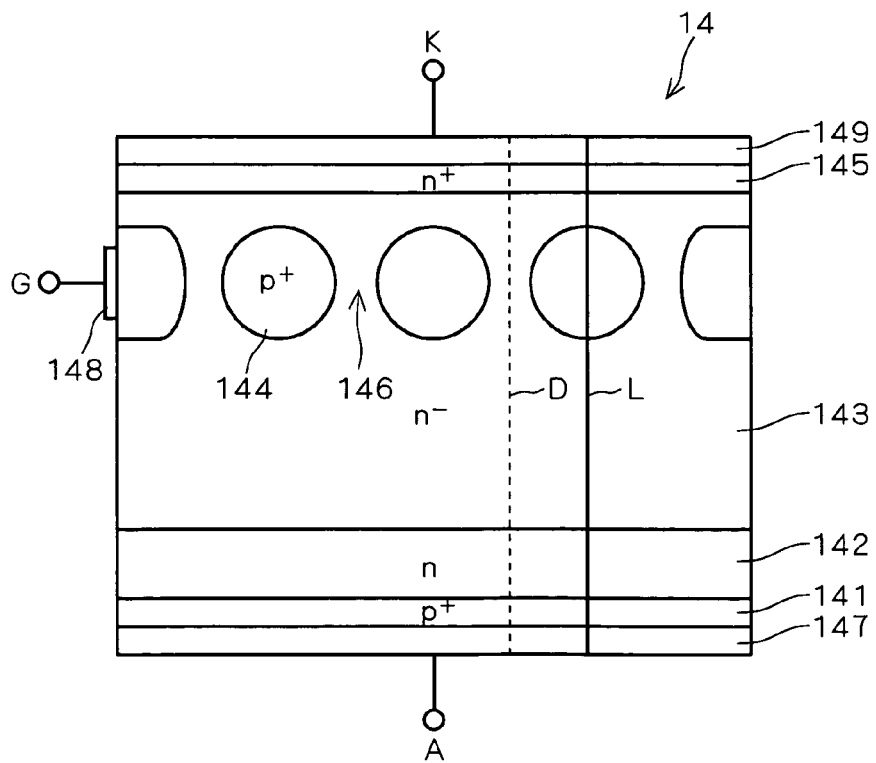
FIG. 2 is a schematic sectional view showing a sectional structure of an SIThy.

FIG. 2 is a schematic sectional view showing a sectional structure of the SIThy 14 of substantially circular shape.

The SIThy 14 includes a p-emitter (anode emitter) region 141, an n-buffer region 142, an n-base region 143, a p-base region 144 and an n-emitter (cathode emitter) region 145. The p-emitter region 141, n-buffer region 142, n-base region 143 and n-emitter region 145 are stacked in this order in adjacent relation to one another, and the p-base region 144 is present as a plurality of buried regions buried in the n-base region 143. Spacing between the respective buried regions of the p-base region 144 serves as a channel 146 through which carriers pass. In short, the SIThy 14 has a channel structure in which the p-base region 144 is buried in the n-base region 143.

The p-emitter region 141, p-base region 144 and n-emitter region 145 are connected to an anode electrode 147, a gate electrode 148 and a cathode electrode 149, respectively. The gate electrode 148 is made of metal or a polycrystalline semiconductor of low resistance such as polysilicon, and is brought into ohmic contact with the p-base region 144. That is, the SIThy 14 has a junction-gate structure in which the gate electrode 148 is in direct contact with the p-base region 144 without any oxide film interposed therebetween. Accordingly, the SIThy 14 is current-driven to be capable of transferring carriers (pulling out holes) at high speeds in the turn-off state.

Among the above-mentioned regions, the p-emitter region 141, p-base region 144 and n-emitter region 145 contain impurities of high concentration. The n-base region 143 has an impurity concentration ranging approximately from $10^{12}/cm^3$ to $10^{13}/cm^3$, lower than that of the n-buffer region 142.

When the gate-cathode (G-K) path is positively biased, the gate potential of the SIThy 14 drops in the positive direction. Accordingly, electrons are injected into the channel 146, so that the SIThy 14 is ready to be turned on. The SIThy 14 can be turned on in a time period ranging from 50 ns to 100 ns when the gate G is current-driven so that carriers are injected at high speeds, and can also be turned on within 1 µs when the gate G is voltage-driven.

Figure 3:
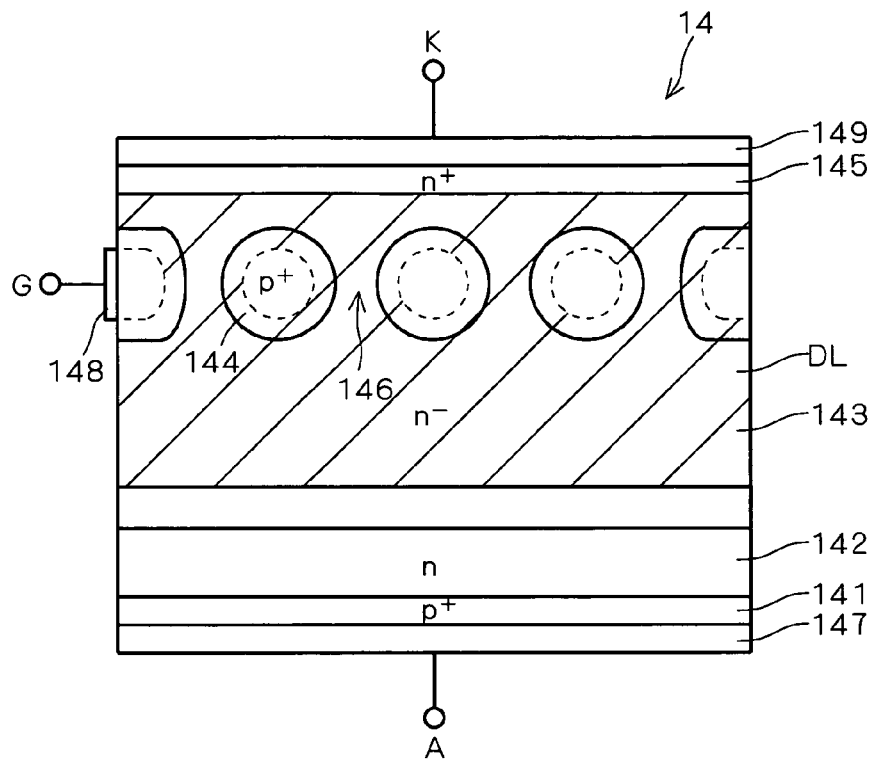
FIG. 3 is a schematic sectional view showing an n-base region of the SIThy shown in FIG. 2 with a depletion layer generated therein.

On the other hand, when the gate-cathode (G-K) path is reversely biased, holes are pulled out from the gate G, so that the gate potential of the SIThy 14 rises in the negative direction. Accordingly, a depletion layer DL including the p-base region 144 therein is generated in the SIThy 14. FIG. 3 is a schematic sectional view showing the n-base region 143 of the SIThy 14 with the depletion layer DL (as hatched) generated therein.

Figure 4:
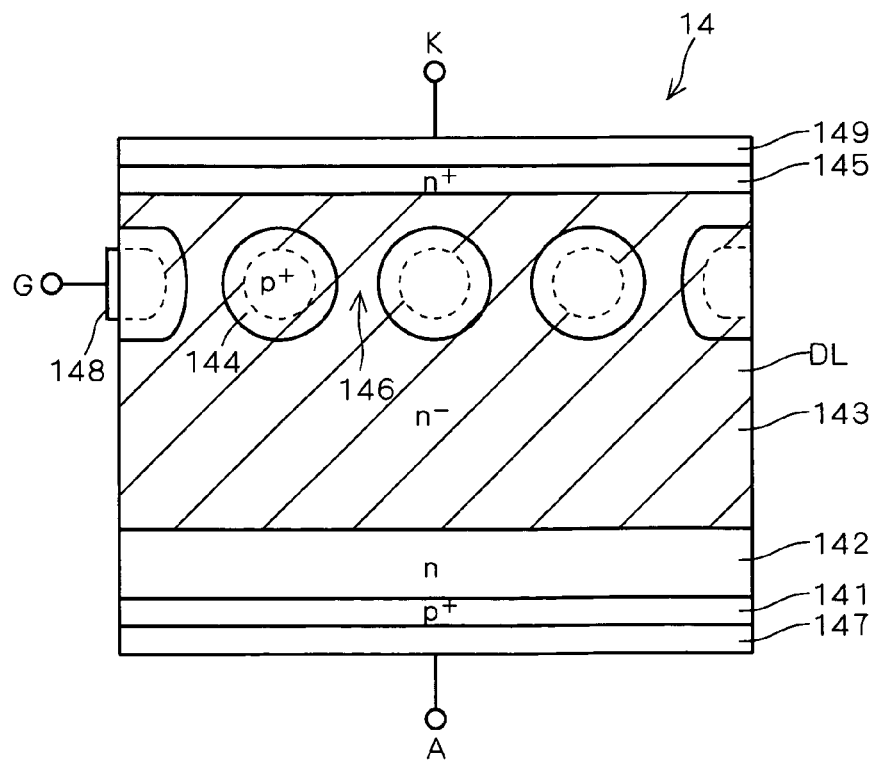
FIG. 4 is a schematic sectional view showing a punch-through state of the SIThy shown in FIG. 2.

When the depletion layer DL is generated in the n-base region 143, the anode-gate (A-G) circuit of the SIThy 14 serves as an element equivalent to a capacitive element having a depletion layer capacitance C. Further, when the depletion layer DL is generated in the SIThy 14, a potential difference is created between the anode A and gate G of the SIThy 14 since an electric field is generated in the depletion layer DL. The depletion layer DL extends as the amount of holes pulled out from the gate G of the SIThy 14 increases, and finally reaches the n-buffer region 142, where its extension becomes gentle. The state in which the depletion layer DL reaches the n-buffer region 142 and the n-base region 143 and depletion layer DL become equal in thickness will hereinafter be called a "punch-through state". FIG. 4 is a schematic sectional view showing the punch-through state of the SIThy 14. When the SIThy 14 is brought into the punch-through state due to an abrupt switching action, a steep electric field is generated at and around an interface between the n-base region 143 and n-buffer region 142, carriers are locally induced by the steep electric field, and leakage current flows because of carrier movement. Generally, as compared to a semiconductor device of non-punch-through type in which the punch-through phenomenon does not take place, the semiconductor device of punch-through type is characterized by a fast flow of current between main electrodes since a substrate between the main electrodes can be made thin, and also characterized by a low turn-on power loss because of low conduction resistance. It is preferable that such punch-through type semiconductor device should be used as a substrate structure of the SIThy 14 as the closing switch function of the SIThy 14 is important to the IES circuit 2, however, the turn-on performance is degraded when the n-buffer region 142 is too thick or has an excessively high impurity concentration.

Operation of Pulsed Power Supply

Figure 5:
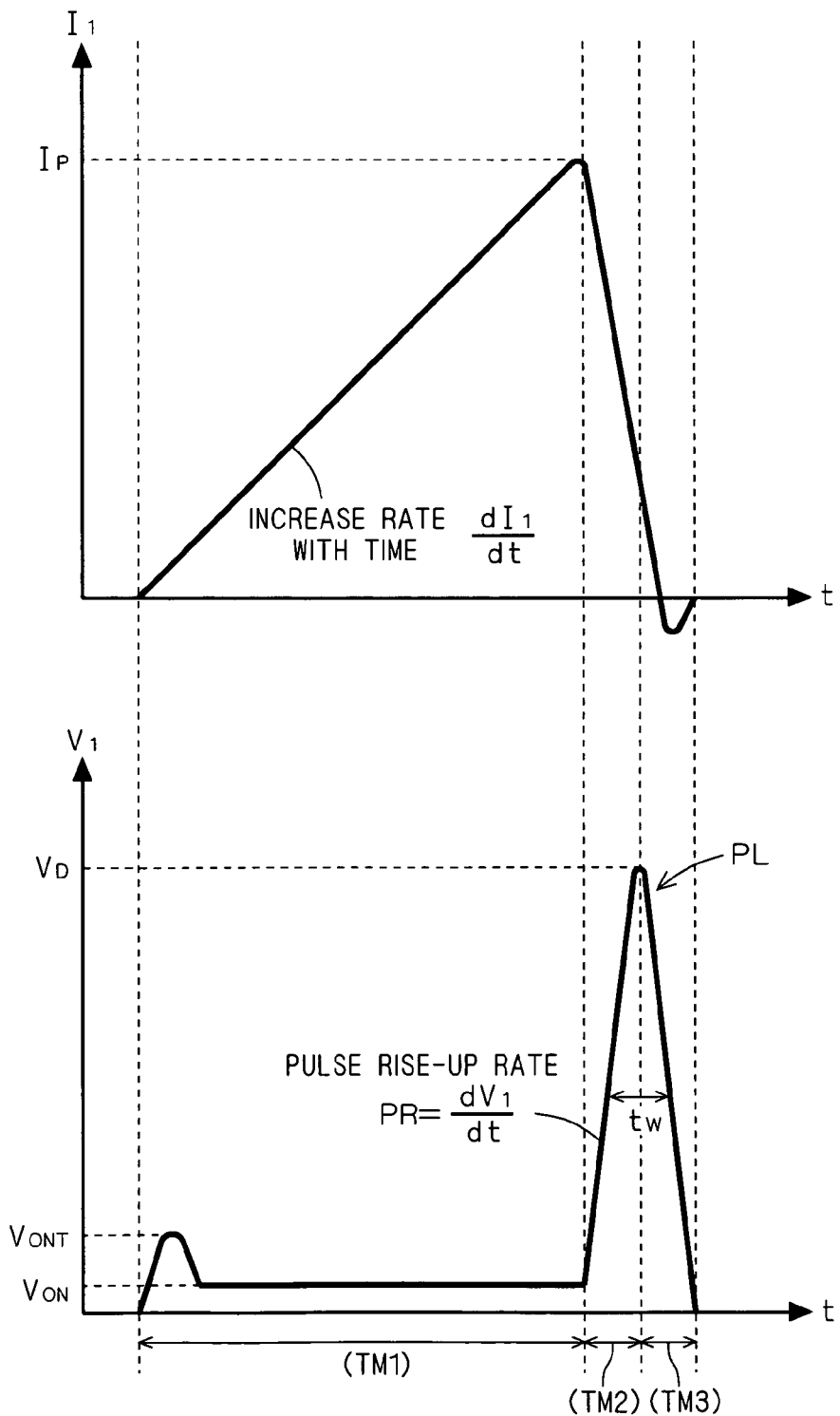
FIG. 5 shows the rate of change with time of each of a primary current and a primary voltage in a primary winding of a step-up transformer during generation of a high-voltage pulse.

FIG. 5 shows the change with time of each of a primary current $I_1$ and a primary voltage $V_1$ in the primary winding T1 of the step-up transformer 13 during generation of a high-voltage pulse. Referring to FIG. 5, operations of the IES circuit 2 and SIThy 14 during generation of a high-voltage pulse will be described in the order of processes 1 to 3.

Process 1

The process 1 in a time period (TM1) shown in FIG. 5 is the process of storing high-voltage pulse energy as magnetic field energy in the primary winding T1 (hereinafter briefly referred to as an "inductive element" as well) of the step-up transformer 13 serving as an inductive element.

First, a turn-on signal is transmitted from the gate drive circuit 16 to the FET 15, so that the drain-source (D-S) circuit of the FET 15 is turned on. This brings the gate G of the SIThy 14 to be positively biased with respect to the cathode K, allowing the gate potential to drop. With this gate potential drop, electrons are injected into the channel 146, so that the SIThy 14 is turned on.

When the SIThy 14 is turned on, current starts flowing in the primary winding T1 of the step-up transformer 13 (a main current flowing in the IES circuit 2 at this time is indicated by an arrow AR1 in FIG. 1). The rate of increase of this current with time, $dI_1/dt$ is given by the following equation (1).

$$\frac{dI_1}{dt} = \frac{Vo}{L} \quad (1)$$

In the process 1, the diode 17 is reversely biased. Therefore, in the process 1, the SIThy 14 is not turned on at high speeds by driving the gate G by current, but turned on in a time period of not longer than 1 μs by voltage-driving the gate G. By voltage-driving the gate G of the SIThy 14, the SIThy 14 is normally turned on even though no positive hole injection from the gate G takes place.

Further, in the process 1, a transient on-state voltage $V_{ONT}$ is generated just after the turn-on of the SIThy 14, and a steady on-state voltage $V_{ON}$ is generated after the disappearance of the transient on-state voltage $V_{ONT}$. The generation of the transient on-state voltage $V_{ONT}$ results from a shortage of carriers filled in the substrate of the SIThy 14 just after the turn-on of the SIThy 14.

Process 2

The process 2 in a time period (TM2) shown in FIG. 5 is the process of storing electric charges in the SIThy 14 caused to serve as a capacitive element by the depletion layer DL, thereby generating a high voltage. More specifically, it is the process of transferring the magnetic field energy stored in the inductive element to electric field energy stored in the capacitive element, thereby generating a high voltage. The depletion layer DL constituting the capacitive element for storing the electric field energy is generated by pulling out holes serving as carriers from the vicinity of the n-base region 143 of the SIThy 14 through the gate electrode 148.

First, a turn-off signal is transmitted from the gate drive circuit 16 to the FET 15 at about a point in time when the current $I_1$ reaches a peak current $I_P$, bringing the drain-source (D-S) circuit of the FET 15 into the off state, so that current supply from the low-voltage dc power supply 11 to the inductive element is stopped. Electric energy E having been supplied from the dc power supply 11 to the inductive element up to this time is given by the following equation (2).

$$E = \frac{1}{2}LI_P^2 \quad (2)$$

The stop of current supply commutates current to flow from the primary winding T1 of the step-up transformer 13 to the SIThy 14 (a main current flowing in the IES circuit 2 at this time is indicated by an arrow AR2 in FIG. 1). With this current, holes are pulled out from the n-base region 143 of the SIThy 14, allowing the depletion layer DL including the p-base regions 144 therein to extend in the n-base region 143. Since the potential difference between the anode A and gate G of the SIThy 14 grows as the depletion layer DL extends, the peak voltage $V_D$ of high value is generated between the anode A and gate G of the SIThy 14 after a lapse of a certain time period after the turn-off of the SIThy 14. Since the current flowing in the diode 17 for pulling out holes is a forward current, the turn-off action in the process 2 is performed at high speeds by current-driving. Therefore, the peak voltage $V_D$ abruptly rises in a time period of several nanoseconds. This peak voltage $V_D$ is applied to the primary winding T1 of the step-up transformer 13, stepped up as necessary, and is output from the secondary winding T2. Further, the peak voltage $V_D$ rises according to the degree of magnetic field energy (equal to the electric energy E) stored in the inductive element. Therefore, the IES circuit 2 is capable of varying the peak voltage $V_D$ of a pulse generated after the turn-off of the SIThy 14 by varying the peak current $I_P$ in the on-state period of the SIThy 14.

Process 3

The process 3 in a time period (TM3) shown in FIG. 5 is the process of discharging electric charges stored in the capacitive element.

First, after the energy stored in the inductive element (the primary winding T1 of the step-up transformer 13) except for a loss of energy consumed by circuit power loss is transferred to the capacitive element (SIThy 14), current flows in the IES circuit 2 in a reverse direction to that in the process 2 (a main current flowing in the IES circuit 2 at this time is indicated by an arrow AR3 in FIG. 1). This current flows from the anode A to gate G of the SIThy 14 through the diode 17 brought into a reverse conducting state by the reverse recovery phenomenon. This current allows the potential difference between the anode A and gate G of the SIThy 14 to abruptly drop. In the process 3, the gate potential also drops, bringing the channel 146 into the conducting state, which also contributes to an abrupt drop in the potential difference between the anode A and gate G of the SIThy 14.

In the IES circuit 2, the electric energy E shown in the equation (2) except for a loss of energy consumed by circuit power loss can be taken out as a high-voltage pulsed energy. Since the SIThy 14 is less influenced by the transient on-state voltage $V_{ONT}$ and the on-state voltage $V_{ON}$ is relatively low, it is possible to reduce a loss of energy, so that a high-voltage pulse generator with low power loss can be achieved.

Pulse width tw of a high-voltage pulse PL generated through the processes B and C is proportional to the reciprocal of the resonance frequency of the inductive element and capacitive element, and is given by the following approximate formula (3).

$$tw \approx \pi (LC)^{1/2} \qquad (3)$$

Thickness and Impurity Concentration of N-Base Region

FIG. 6 shows relationships among the state of depletion layer DL in the n-base region 143, on-state voltage $V_{ON}$, peak voltage $V_D$ and pulse width tw when the peak current $I_P$ is varied in five ways from 50 to 350 A in order to obtain a target peak voltage from 1000 to 5000 V.

As is apparent from FIG. 6, thickness $W_V$ of the depletion layer DL increases as the peak current $I_P$ increases to reach 250 A (when the target peak voltage is 4000 V). When the peak current $I_P$ is further increased above 250 A, the thickness $W_V$ of the depletion layer DL does not increase. This is the aforementioned punch-through state.

The on-state voltage $V_{ON}$ increases as the peak current $I_P$ increases. The peak voltage $V_D$ also increases as the peak current $I_P$ increases, but its increase tends to be saturated above 250 A at which the SIThy 14 is brought into the punch-through state. In other words, even when the peak current $I_P$ is increased from 250 to 350 A after the SIThy 14 is brought into the punch-through state, the peak voltage $V_D$ only increases from 4000 to 4200 V without reaching the target peak voltage (peak voltage $V_D$ that can be achieved when the punch-through phenomenon does not occur) of 5000 V. On the other hand, the pulse width tw increases above 250 A. This is because a steep, strong electric field is generated in the n-buffer region 142 when the punch-through state is brought about, where carriers are locally generated, causing leakage current to flow forward, so that a rise in the forward voltage is avoided. This is also described in "Pulse Switching Characteristics of SI-Thyristor relating to the Applied Voltage" Naohiro Shimizu, et al., Symposium of Institute of Electrical Engineers of Japan (Mar. 27, 2002). When an abrupt punch-through state is brought about, carriers in the SIThy 14 increase, and the turn-off speed thus decreases, relieving switching characteristics of the SIThy 14 as an opening switch, which results in a reduction of the rise-up rate dV/dt of output voltage from the IES circuit 2. Therefore, safety functions can be achieved.

The SIThy 14 having characteristics shown in FIG. 6 is configured such that the peak voltage $V_D$ (4000 V in this case) achieved by the peak current $I_P$ at which the punch-through state is brought about does not exceed 5000 V which is the threshold breakdown voltage of static characteristics of the SIThy 14. More specifically, the SIThy 14 is configured such that an increase in the peak voltage $V_D$ relative to an increase in the electric energy E supplied from the low-voltage dc power supply 11 saturates in the vicinity of a saturation voltage (4000 V in this case) not more than the threshold breakdown voltage (5000 V in this case). With such configuration, an SIThy can be achieved having the peak voltage $V_D$ not exceeding the threshold breakdown voltage of the SIThy 14 even with an increase in the peak current $I_P$ and having a self protecting function of autonomously preventing its breakdown.

A more specific configuration of such SIThy 14 will be described now.

The peak voltage $V_D$ achieved by the peak current $I_P$ at which the punch-through state is brought about depends on the total number of carriers in the n-base region 143. The total number of carriers is determined by the impurity concentration and a physical dimension, thickness $W_T$ of the n-base region 143, and relationship given by the following equation (4) holds.

$$W = \sqrt{\frac{2 \cdot \varepsilon_s \cdot (V_{bi} + V_D)}{q \cdot N_b}} \qquad (4)$$

where $\varepsilon_s$ is the dielectric constant, q is the elementary electric charge of carriers, and $N_b$ is the impurity concentration of substrate.

Figure 8:
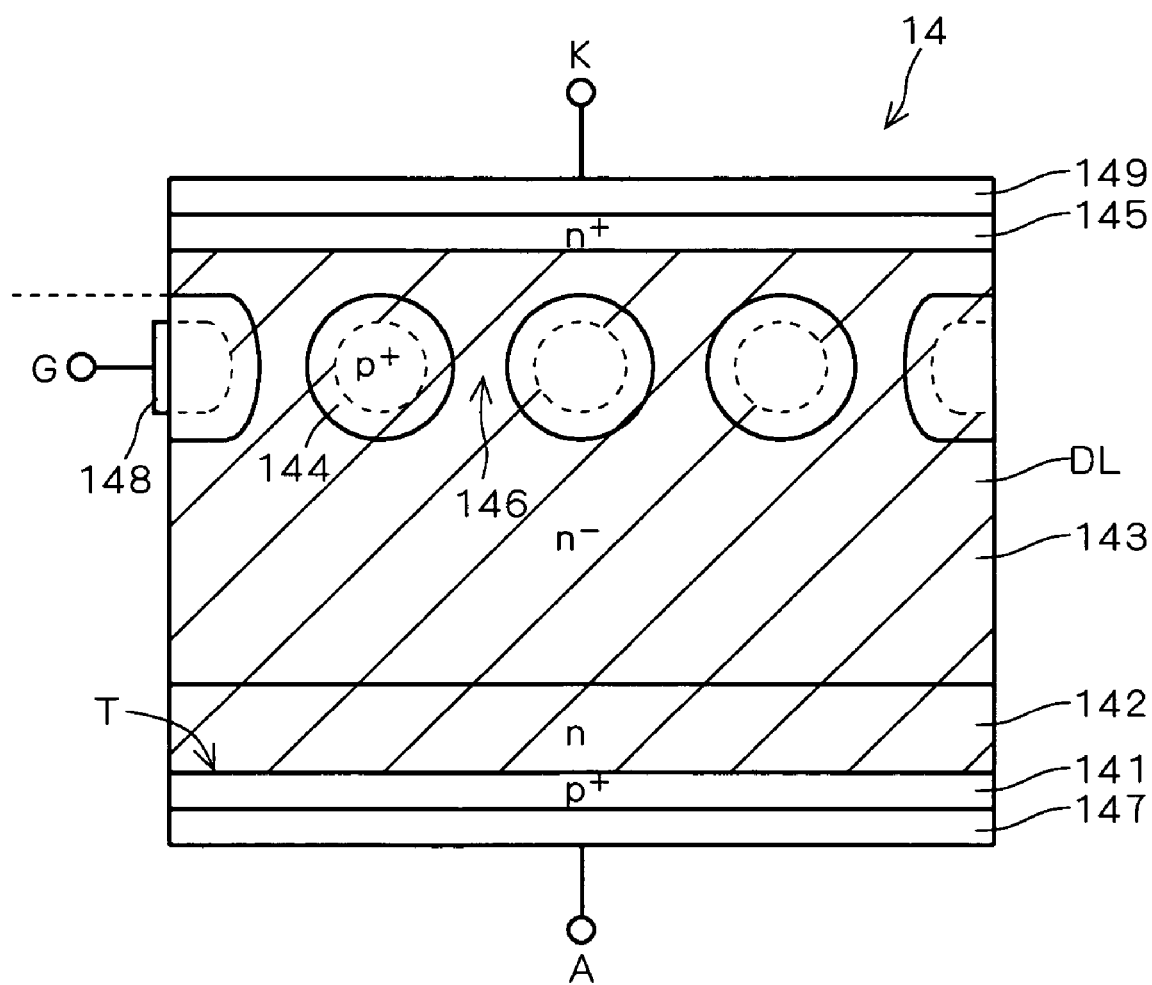
FIG. 8 is a schematic sectional view showing the depletion layer having reached an interface.

By determining the thickness $W_T$ and impurity concentration of the n-base region 143 such that the peak voltage $V_D$ obtained from the equation (4) is not more than the threshold breakdown voltage of the SIThy 14, and preferably, about 80% (considered as a practical breakdown voltage) of the threshold breakdown voltage, the SIThy 14 having the above-described self protecting function can be achieved. In the static characteristic breakdown voltage of SIThy, the SIThy needs to be safely configured to have a forward breakdown voltage of not less than the practical breakdown voltage. This arises the need to provide the n-buffer region 142 having the minimum impurity concentration and minimum thickness required to ensure a main breakdown voltage on the p-emitter region 141. More specifically, the depletion layer DL extends to reach the n-buffer region 142 as the peak current $I_P$ increases above the value at which the above-described punch-through state is bought about, and finally, as shown in FIG. 8, the depletion layer DL reaches an interface T between the p-emitter region 141 and n-buffer region 142, causing current flowing between the anode A and gate G of the SIThy 14 to abruptly increase. Therefore, the thickness and impurity concentration which determine the doping amount of carriers are determined such that the depletion layer DL does not reach the interface T between the p-emitter region 141 and n-buffer region 142 until a generated voltage reaches a value corresponding to the static characteristics breakdown voltage (a breakdown voltage in a non-pulsed operation).

On the other hand, when increasing the thickness and impurity concentration of the n-buffer region 142, the doping amount of carriers in the n-buffer region 142 increases, and power loss and switching speed of the SIThy 14 degrade. Accordingly, the thickness and impurity concentration of the n-buffer region 142 are each reduced to a minimum within allowable ranges of power loss and switching speed of the IES circuit 2. Therefore, the thickness and impurity concentration of the n-buffer region 142 are determined such that the depletion layer DL reaches the interface T between the p-emitter region 141 and n-buffer region 142 just at a point in time when the generated voltage reaches a value corresponding to the static characteristics breakdown voltage. This makes it possible to ensure the breakdown voltage of the SIThy 14 as well as to prevent degradation in power loss and switching speed.

Effective Channel Area of SIThy

Figure 7:
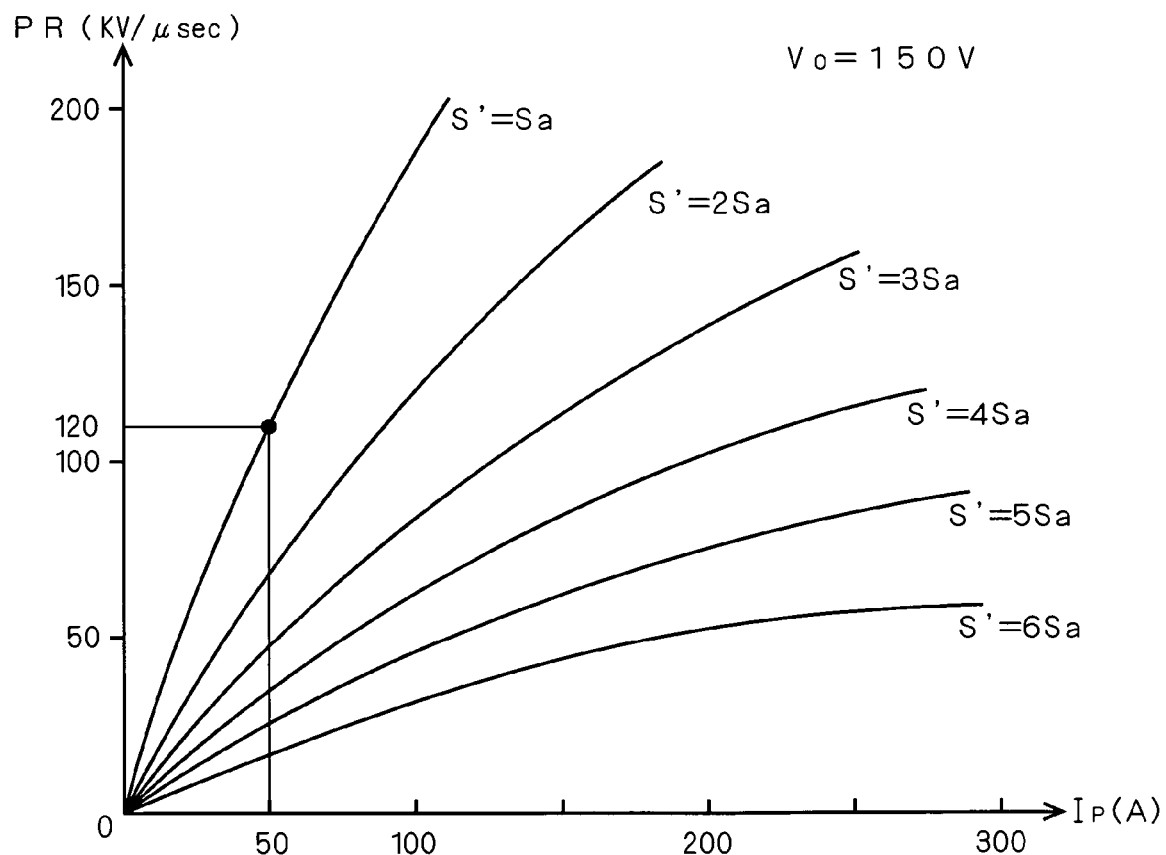
FIG. 7 shows relationships between the peak current and pulse rise-up rate when an effective channel area of the SIThy shown in FIG. 2 is varied.

FIG. 7 shows relationships between the peak current $I_P$ and a rise-up rate with time (hereinafter also referred to as "pulse rise-up rate") $PR=dV_1/dt$ of the primary voltage $V_1$ at a rising edge of the high-voltage pulse PL when an effective channel area S' of the SIThy 14 is varied in six ways from Sa to 6Sa. In FIG. 7, the voltage $V_0$ is 150 V, and the substrate thickness and impurity concentrations of the respective regions are equal in the respective cases except for the effective channel area S'. Since the current capacity of the SIThy 14 depends on the effective channel area S', FIG. 7 can also be considered as showing relationships between the peak current $I_P$ and pulse rise-up rate PR when the SIThy 14 is varied in current capacity in six ways from 50 to 300 A. Since the size of the SIThy 14 (an area of a main surface of a semiconductor stacked structure constituting the SIThy 14) and the effective channel area Sa (a cross-sectional area in a surface direction parallel to the main surface) have a positive correlation, FIG. 7 can also be considered as showing relationships between the peak current $I_P$ and pulse rise-up rate PR when the SIThy 14 is varied in size in six ways from sa to 6sa.

As is apparent from FIG. 7, the peak current $I_P$, i.e., electric energy E and pulse rise-up rate PR have a positive correlation when the effective channel area S' of the SIThy 14 is constant. This is because the peak current $I_P$ little influences on the pulse width tw whereas the peak voltage $V_D$ increases as the peak current $I_P$ increases until the SIThy 14 is brought into the punch-through state.

On the other hand, the effective channel area S' of the SIThy 14 and pulse rise-up rate PR have a negative correlation when the peak current $I_P$ is constant. This is because, as the effective channel area S' of the SIThy 14 decreases, a capacitance C of the capacitive element obtained when the SIThy 14 is caused to serve as a capacitive element by the depletion layer DL decreases and the pulse width tw is narrowed. This is based on the correlation of capacitance C, current I and generated voltage V where the relation dV/dt=I/C holds.

In accordance with the above characteristics, the maximum effective channel area $S_{max}$ of the SIThy 14 is determined once the electric energy E, i.e., the peak current $I_P$ is determined based on energy required for a high-voltage pulse considering circuit power loss in the IES circuit 2 and the pulse rise-up rate PR for obtaining a necessary high-voltage pulse is determined. For instance, in the case where the peak current $I_P$ needs to be 50 A and pulse rise-up rate PR needs to be 120 kV/μs in order to obtain a desired high-voltage pulse in the IES circuit 2, the effective channel area S' of the SIThy 14 is limited to Sa or smaller. Determining the effective channel area S' (i.e., the current capacity or size) of the SIThy 14 as described above makes it possible to reduce the SIThy 14 to a minimum size.

To increase the pulse rise-up rate PR, the effective channel area S' needs to be reduced to a minimum, however, size reduction due to an excessive reduction in the effective channel area S' may make heat radiation difficult, resulting in thermal runaway during the operation of the IES circuit 2. Therefore, it is preferable that the effective channel area S' should be of size, as a lower limit, having a thermal resistance capable of diffusing heat generated in the SIThy 14.

Channel Structure

Figure 9A:
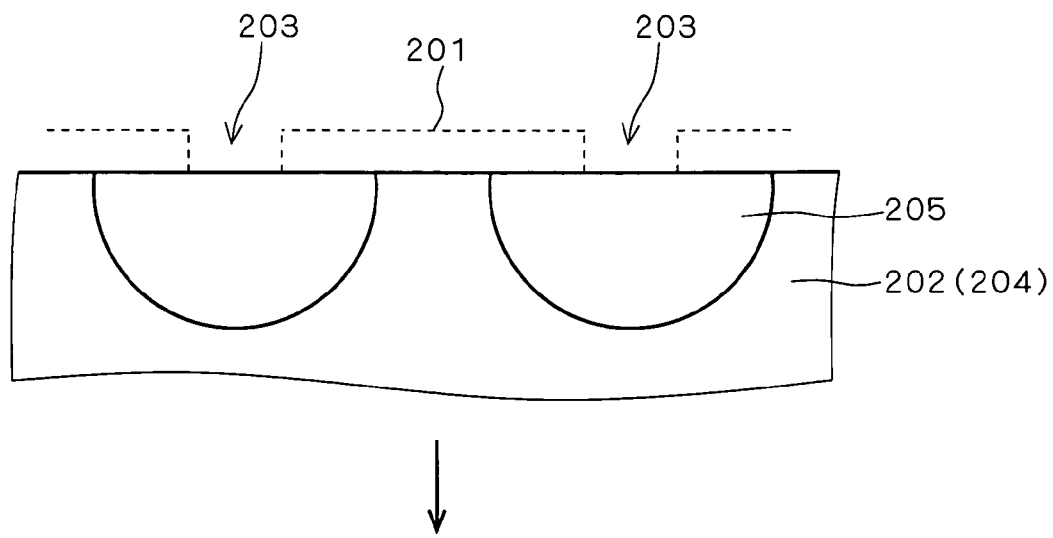
FIGS. 9A and 9B are process drawings showing how a channel of the SIThy shown in FIG. 2 is formed.
Figure 9B:
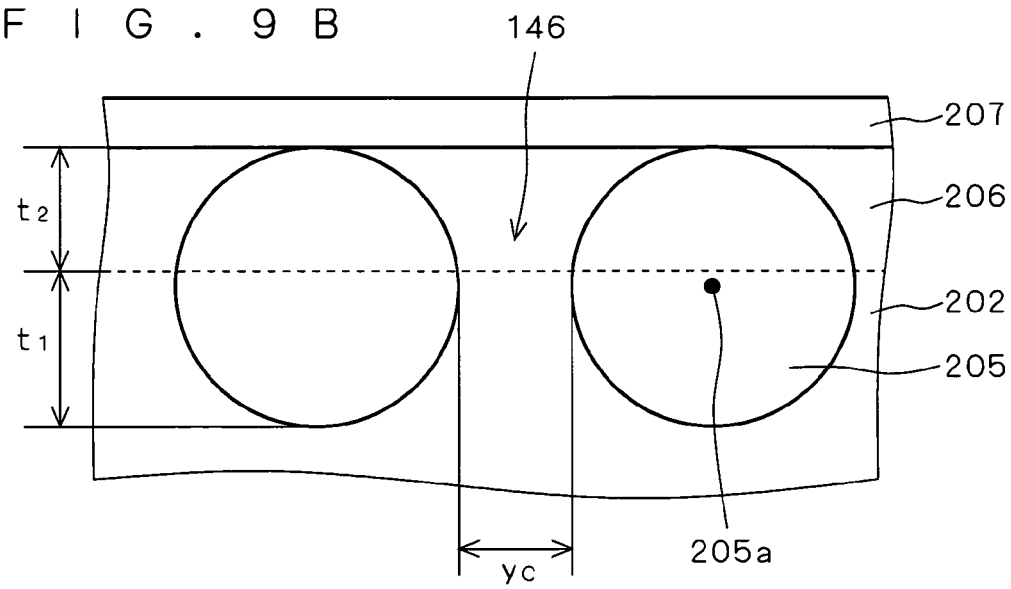

FIGS. 9A and 9B are process drawings showing how the channel 146 of the SIThy 14 is formed (in schematic cross section). FIG. 9B illustrates the channel 146 and its surrounding on an enlarged scale. The channel 146 of the SIThy 14 will be described in detail referring to FIGS. 9A and 9B.

First, p-type impurities are diffused through an uncovered part 203 on an n-type semiconductor substrate 202 with an $SiO_2$ film 201 formed on its surface, to form a p-base region 205 in an n-base region 204 (the n-type semiconductor substrate 202) (FIG. 9A). Then, the $SiO_2$ film 201 is removed, and an n-type region 206 and an n-emitter region 207 are epitaxially grown, to form the channel 146 (FIG. 9B).

The impurity concentration near the center 205a of the p-base region 205 is not less than $5 \times 10^{18}/cm^2$. The p-base region 205 has a thickness $t_1$ in the n-type semiconductor substrate 202 ranging from 3 to 15 μm, and a depth $t_2$ of an epitaxially grown part of the p-base region 205 ranges from 2 to 10 μm. It is preferable that a distance between adjacent p-base regions 205, i.e., a channel width yc should be not less than 0.5 μm and not more than 2.5 μm.

Figure 10:
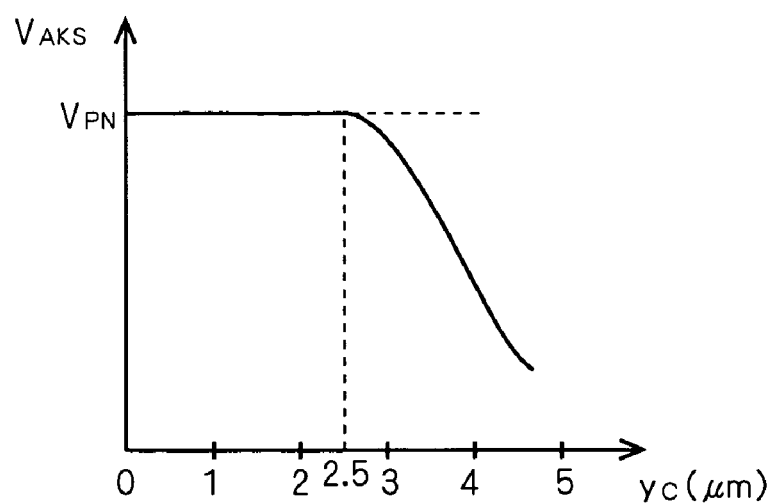
FIG. 10 shows relationships between a channel width and a breakdown voltage.

This is because, as shown in FIG. 10, in the case where the channel width yc exceeds the upper limit of 2.5 μm, the threshold breakdown voltage $V_{AKS}$ in the G-K shorted state becomes significantly lower than the breakdown voltage $V_{PN}$ obtained when applying a negative bias to the gate or a forward breakdown voltage of a substrate structure having a flat p-base layer with no channel formed therein. Therefore, the channel width yc and impurity concentration in the channel structure are determined such that the anode-gate breakdown voltage in a gate-cathode G-A shorted state in the case where the channel structure is made only of the p-base region 144 can be maintained. When the threshold breakdown voltage $V_{AKS}$ falls outside a range substantially equal to that of the breakdown voltage $V_{PN}$ which is a substrate design voltage, i.e., not less than 0.9-times and not more than 1.1-times, it is difficult to generate a high-voltage pulse of the same level as the breakdown voltage $V_{PN}$ in the IES circuit 2.

Figure 11:
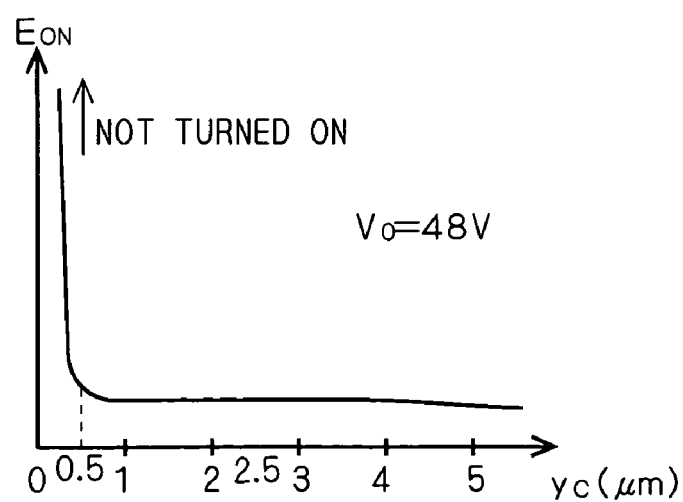
FIG. 11 shows relationships between the channel width and turn-on power loss.

On the other hand, when the channel width yc reaches the lower limit of 0.5 μm or less, the turn-on power loss $E_{ON}$ significantly increases as shown in FIG. 11, making it difficult to achieve a turn-on at the voltage $V_0$ (48 V in FIG. 11) which is relatively low.

Since the above-described upper and lower limits depend on the impurity concentrations and physical dimensions of the respective regions, it is preferable that the channel width yc should be determined for each device considering these determinants.

Figure 12:
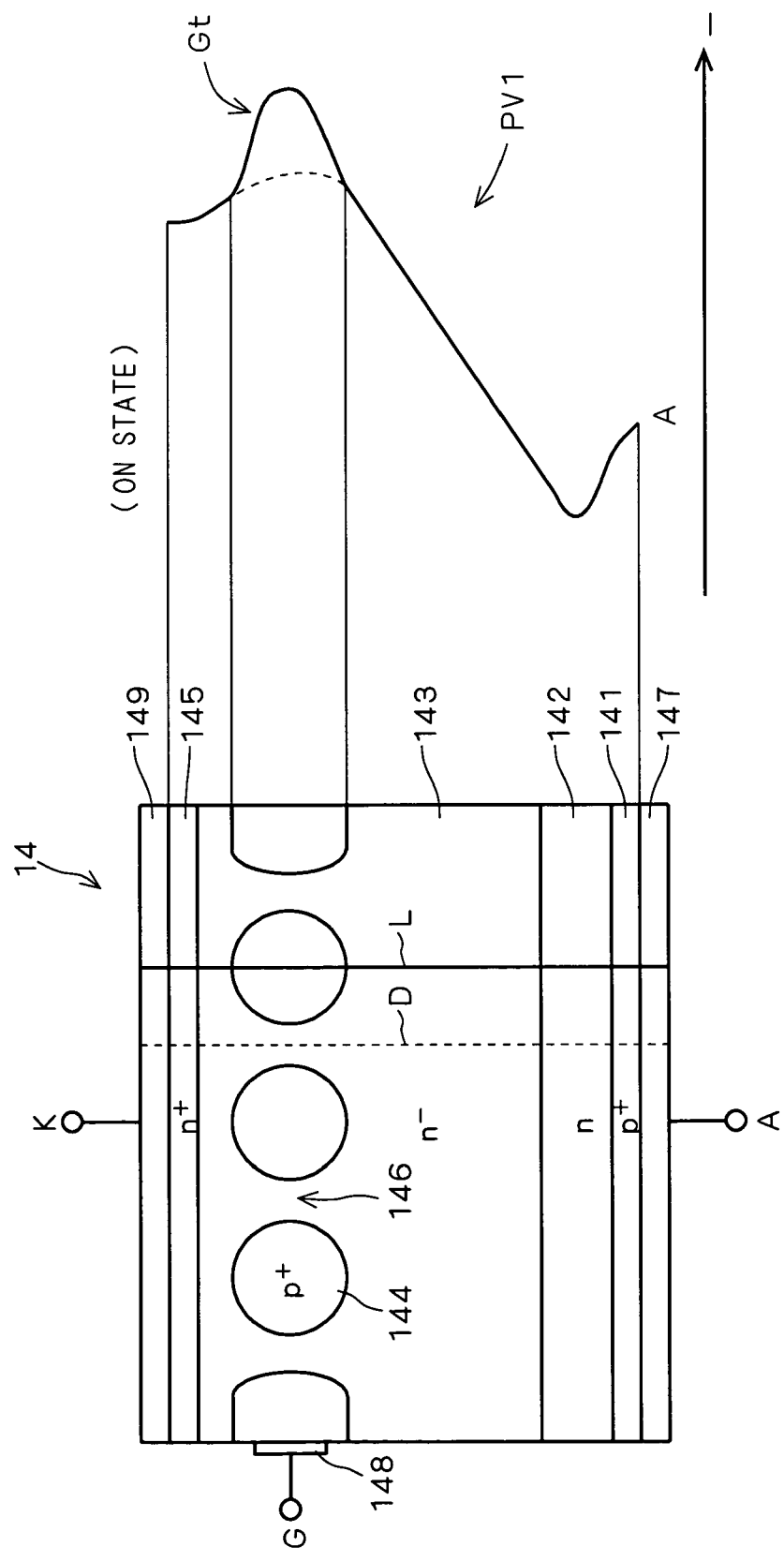
FIG. 12 shows potential change in the off state of the SIThy shown in FIG. 2 along the dotted lines and solid line shown in FIG. 2.
Figure 13:
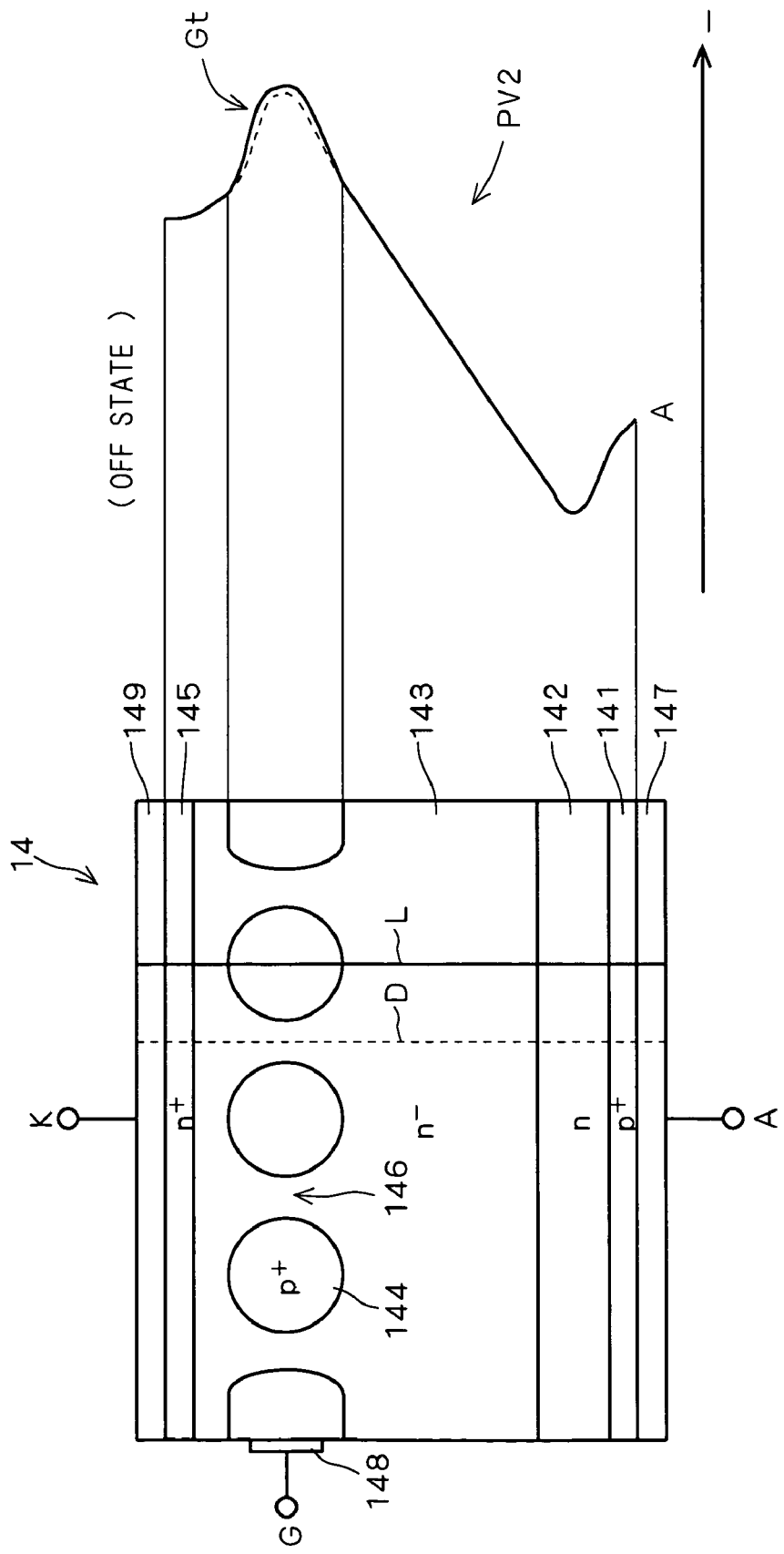
FIG. 13 shows potential change in the on state of the SIThy shown in FIG. 2 along the dotted lines and solid line shown in FIG. 2.

The channel width yc and impurity concentrations may be determined based on the gate potential. In this respect, FIGS. 12 and 13 are referred to. FIG. 12 shows potential change PV1 in the off state of the SIThy 14 along the dotted lines D in the channel 146 and solid line L in a non-channel part shown in FIG. 2. FIG. 13 shows potential change PV2 in the on state of the SIThy 14 along the dotted lines D and solid line L shown in FIG. 2.

As indicated by the potential change PV1, the gate potential Gt in the channel 146 drops in the positive direction relative to that of the non-channel part in the on state, bringing the channel 164 into the conducting state. In contrast, as indicated by the potential change PV2, the gate potential Gt in the channel 146 approaches that of the non-channel part, bringing the channel 146 into the non-conducting state. In the IES circuit 2, the cathode K is disconnected from the closed circuit in the off state, in which no bias is applied to the gate-cathode G-K path, however, a high-voltage pulse can be generated by determining the channel width yc and impurity concentrations such that the potential change PV2 is achieved even in this state.

While the invention has been shown and described in detail, the foregoing description is in all aspects illustrative and not restrictive. It is therefore understood that numerous modifications and variations can be devised without departing from the scope of the invention.

What is claimed is:

1. A junction-gate type static induction thyristor for use in a high-voltage pulse generator which uses an inductive element, a path from an anode to a cathode of said junction-gate type static induction thyristor being connected to said inductive element in series, said junction-gate type static induction thyristor comprising:
    a p-emitter region connected to said anode;
    an n-buffer region provided on said p-emitter region;
    an n-base region provided on said n-buffer region;
    a p-base region buried in said n-base region and connected to a gate of said junction-gate type static induction thyristor; and
    an n-emitter region provided on said n-base region and connected to said cathode, wherein
    a voltage of a high-voltage pulse generated by said high-voltage pulse generator saturates at no more than a saturation voltage when electric energy supplied from a power supply is increased with an increase in energy of said high-voltage pulse, said saturation voltage being not more than an anode-cathode forward breakdown voltage obtained when a gate-cathode circuit of said junction-gate type static induction thyristor is shorted.

2. The junction-gate static induction thyristor according to claim 1, wherein
    the thickness and impurity concentration of said n-base region are determined such that said n-base region and a depletion layer are equal in thickness when the voltage of said high-voltage pulse reaches said saturation voltage, said n-base region provided inside a semiconductor substrate forming said junction-gate type static induction thyristor, a main current flowing through said n-base region when said junction-gate type static induction thyristor is in an on state, said depletion layer being generated in said n-base region when current supply to said anode-cathode path is stopped during generation of said high-voltage pulse by said high-voltage pulse generator, and
    the thickness and impurity concentration of said n-buffer region are determined such that said depletion layer reaches an interface between said n-buffer region and said p-emitter region, said depletion layer being generated inside said semiconductor substrate when a voltage corresponding to an anode-cathode forward breakdown voltage as static characteristics of said junction-gate type static induction thyristor is applied forward to said anode-cathode path of said junction-gate type static induction thyristor.

3. The junction-gate type static induction thyristor according to claim 1, wherein
    a gate electrode and said p-base region are in ohmic contact, said gate electrode being capable of flowing current therethrough.

4. The junction-gate type static induction thyristor according to claim 1, wherein
    a semiconductor substrate forming said junction-type static induction thyristor is made of at least one selected from the group consisting of Si, SiC and GaN.

* * * * *